United States Patent [19]
Thakur et al.

[11] Patent Number: 5,738,909
[45] Date of Patent: *Apr. 14, 1998

[54] METHOD OF FORMING HIGH-INTEGRITY ULTRATHIN OXIDES

[75] Inventors: Randhir P. S. Thakur; Annette Martin, both of Boise, Id.

[73] Assignee: Micron Technology, Inc.

[*] Notice: The term of this patent shall not extend beyond the expiration date of Pat. No. 5,264,396.

[21] Appl. No.: 587,104

[22] Filed: Jan. 10, 1996

[51] Int. Cl.$^6$ ............................................. H01L 21/02
[52] U.S. Cl. .................. 427/255.4; 427/553; 427/595; 427/309; 427/314; 437/239; 437/241; 437/242; 437/243; 437/244
[58] Field of Search ............................ 427/255.4, 309, 427/553, 595, 314; 437/238, 239, 241, 242, 243, 244

[56] References Cited

U.S. PATENT DOCUMENTS

| | | | |
|---|---|---|---|
| 4,409,260 | 10/1983 | Pastor et al. | 427/82 |
| 4,595,601 | 6/1986 | Horioka et al. | 427/53.1 |
| 5,043,224 | 8/1991 | Jaccodine et al. | 428/446 |
| 5,264,396 | 11/1993 | Thakur et al. | 437/238 |
| 5,360,769 | 11/1994 | Thakur et al. | 437/239 |
| 5,434,109 | 7/1995 | Geissler et al. | 437/239 |

OTHER PUBLICATIONS

Ting, W., et al. "Composition and Growth Kinetics of Ultrathin SiO$_2$ Films Formed by Oxidizing Si Substrates in N$_2$O" Dec. 24, 1990, Appl. Phys. Letter vol. 57:2808–2810, Publ. Austin, TX.

Young, E.M. et al. "Ultraviolet Light Stimulated Thermal Oxidation of Silicon" Jan. 12, 1987, Appl. Phys. Ltr. vol. 50:80–82 Publ. Stanford, CA.

*Primary Examiner*—Roy V. King
*Attorney, Agent, or Firm*—Reed Smith Shaw & McClay

[57] ABSTRACT

A method of forming a layer of oxide on a surface of a wafer is disclosed, in which the wafer surface is heated at a first temperature and a first pressure during a first period of time in a first ambient gas comprising nitrogen and oxygen species at a first concentration, and the wafer surface is heated at a second temperature and a second pressure during a second period of time in a second ambient gas comprising ozone and oxygen at a second concentration. The oxide structure formed thereby is also disclosed.

24 Claims, 3 Drawing Sheets

METHOD OF FORMING HIGH-INTEGRITY ULTRATHIN OXIDES

TECHNICAL FIELD

The present invention relates to the fabrication of integrated circuit devices and, more particularly, to a method of forming high-integrity ultrathin oxides.

BACKGROUND

The demand for faster and more reliable integrated circuit devices has motivated decades of research on the application of basic oxide as a natural and convenient dielectric for silicon-based, as well as other, e.g., GaAs, InP, and germanium-based, devices. The continued increase in density of integrated circuits and correlative demand for circuit devices that consume less power has forced the semiconductor industry to consider new manufacturing techniques that enable fabrication of devices on a submicron scale. In the fabrication of metal-oxide-semiconductor ("MOS") devices, e.g., high-density dynamic random access memories ("DRAM's"), these trends have forced manufacturers to search for methods of achieving thinner layers of high integrity transistor gate oxide and capacitor cell dielectric, respectively.

An ultrathin, e.g., less than 100 angstroms thick, dielectric layer must have good dielectric properties. In this regard, several design considerations are crucial, including (1) uniformity of thickness, (2) imperviousness to electrical and thermal breakdown, (3) high dielectric constant, and (4) overall reliability. Ideally, a high performance, ultrathin dielectric layer should also have a low diffusion rate for impurities, low interface state density and chemical stability.

Silicon dioxide at thicknesses greater than 100 angstroms provides a cost effective, high quality dielectric layer for a single crystal, polycrystalline or amorphous silicon substrate. For a dielectric layer of lesser thickness, however, silicon dioxide has a high defect density and exhibits poor characteristics as a diffusion mask against impurities.

In the past, thermal oxidation typically was accomplished by exposing a wafer to a dry or wet $O_2$ ambient at an elevated temperature in a conventional furnace, resulting in the growth of an oxide layer superjacent the wafer. With such a method, however, the oxide layers can exhibit undesirable characteristics, e.g., high defect densities, charge trapping, low resistance to hot carrier effects, i.e., variations in transconductance and threshold voltage caused by hot-carrier stressing, and overall low reliability.

More recently, the use of Rapid Thermal Processing ("RTP") to form ultrathin oxide layers has been investigated. With this method, the wafer is subjected to Rapid Thermal Oxidation ("RTO") by exposing the wafer to an ambient oxygen source, e.g., nitric oxide ("N2O"), in a rapid thermal processor. Unlike a conventional furnace, which relies on conduction, i.e., resistance heating via electrical coils, to heat the wafer, a rapid thermal processor relies on the radiant energy from a lamp or series of lamps to heat the wafer. Consequently, a rapid thermal processor is capable of a substantially higher ramp rate, e.g., 50° to 200° C./min., than that of a conventional furnace, e.g., 0.5° to 100° C./min. While use of RTO can improve resistance to hot-carrier effects and reduce electron trapping, RTO methods to date have suffered from unacceptable thickness and compositional non-uniformities, high thermal budgets and low throughput. The thickness and compositional non-uniformities are largely caused by the high thermal budgets. These problems prevent RTO from being a viable process in a commercial manufacturing environment.

FIG. 1(a) depicts a temperature versus time profile 18 for a conventional RTO method of forming a 100 angstroms thick layer of oxide. For the same method, FIG. 1(b) depicts the concentration at the surface of the wafer over time for gases that are introduced into the reaction chamber during the process, i.e., hydrogen-containing gas profile 20, dry oxygen profile 21, nitrogen- and/or fluorine-containing gas profile 22, and inert gas, e.g., argon, profile 22.

The steps might proceed as follows: (1) the substrate is pre-baked at approximately 1000 to 1100 degrees Celsius in the presence of HCl, HF, $H_2$, or a combination thereof during a pre-bake period 10, e.g., approximately 20 to 80 seconds, to remove native oxide, (2) the substrate is exposed to a 100 percent dry oxygen ambient at approximately 1000 degrees Celsius during an oxidation period 12, e.g., approximately 2 to 3 minutes, to form the oxide layer, (3) the substrate is post-annealed at approximately 1000 to 1100 degrees Celsius in the presence of a nitrogen- and/or fluorine-containing ambient during a post-anneal period 14, e.g., approximately 30 to 60 seconds, to stabilize the oxide layer and improve its quality, and (4) the substrate is cooled in the presence of an inert abient during a cooling period 16, e.g., approximately 40 seconds.

At such high temperatures, the slip lines, i.e., crystal lattice row defects induced by a temperature gradient, and stacking faults, i.e., missing or dislocated atoms in the crystal lattice, can cause significant degradation of the electrical characteristics of a device. Moreover, the large amount of time required to process each wafer substantially diminishes throughput, making the method infeasible for commercial production.

It is not expected that manufacturers of RTP reaction chambers will be able to provide RTP system designs that alone can solve these problems, due to physical limitations that are inherent to reactor design. Many researchers and manufacturers appreciate the advantages of RTO methods and have suggested improvements in the quality of such methods. See, e.g., Thakur et al., U.S. Pat. No. 5,360,769 (U.S. Class 437/239), issued Nov. 1, 1994, entitled "METHOD FOR FABRICATING HYBRID OXIDES FOR THINNER GATE DEVICES"; Thakur et al., U.S. Pat. No. 5,264,396 (U.S. Class 437/238), issued Nov. 23, 1993, entitled "METHOD FOR ENHANCING NITRIDATION AND OXIDATION GROWTH BY INTRODUCING PULSED $NF_3$". However, no currently-known RTO method overcomes the problems of non-uniformities, high thermal budget and low throughput in a commercial manufacturing environment.

SUMMARY OF THE INVENTION

The current invention provides a method by which the throughput of RTO is increased at a tolerable thermal budget, without sacrificing the reliability and high integrity of oxide layers formed through RTO. A method of forming a layer of oxide on a surface of a wafer is disclosed, in which the wafer surface is heated at a first temperature and a first pressure during a first period of time in a first ambient gas comprising nitrogen and oxygen species at a first concentration, and the wafer surface is heated at a second temperature and a second pressure during a second period of time in a second ambient gas comprising ozone and oxygen at a second concentration. The oxide structure formed thereby is also disclosed.

The advantages of the present invention over conventional techniques are numerous and include the following: (1) commercial viability; (2) high throughput; (3) reduced thermal budget; (4) the ability to produce high-integrity, i.e., low defect density, oxide layers, i.e., layers having lower defect density, that result in highly reliable devices having improved electrical characteristics over devices incorporating conventional oxide; and (5) improved thickness and compositional uniformity, resulting primarily from a reduction in RTP cycle time.

DESCRIPTION OF THE PREFERRED EMBODIMENT

Figure 2:
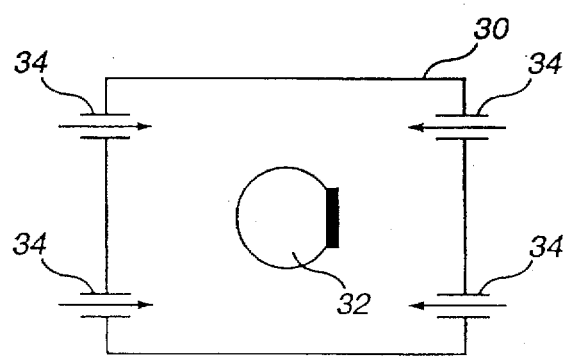
FIG. 2 is a schematic representation of the rapid thermal processing chamber that is utilized in performing a RTO process in accordance with an embodiment of the present invention.

Preferably, the present invention is carried out in a RTP reaction chamber. Referring to FIG. 2, a schematic of a RTP reaction chamber 30 is depicted. A wafer 32 is being processed in reaction chamber 30. Although only one wafer 32 is shown, some RTP reaction chambers permit multiple wafers to be processed simultaneously. Gas flow lines 34 penetrate reaction chamber 30 and permit various gases to be introduced into reaction chamber 30 during appropriate stages of a process, while preventing wafer 32 from being exposed to the atmosphere outside of reaction chamber 30.

Figure 3A:
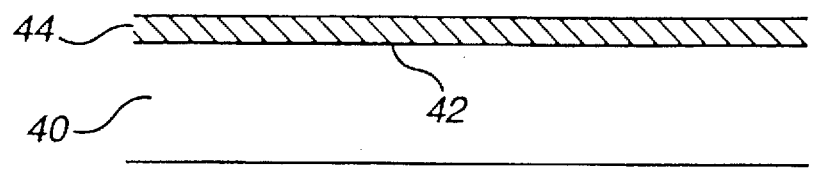
FIG. 3(a) is a schematic cross-section of a semiconductor wafer undergoing an embodiment of the present invention, prior to removal of the native oxide.

Referring to FIGS. 3(a)–(d), a schematic cross-section of a wafer 40 undergoing an embodiment of the present invention is depicted. Referring to FIG. 3(a), the wafer 40 is shown prior to application of an embodiment of the present invention. A native oxide layer 44 has formed superjacent a surface 42 of the wafer 40 as a result of the unintentional exposure of wafer surface 42 to an oxygen-containing ambient gas, e.g., the air. The wafer surface 42 may be the surface of any wafer feature that is capable of being oxidized, e.g., a semiconductor substrate comprising silicon or germanium.

The native oxide is considered to be a contaminant because it has electrical characteristics that are substantially inferior to those of the oxide that will be intentionally formed according to the disclosed process. Other contaminants, e.g., metallic and organic materials, may also be present at the wafer surface 42. Unless removed, these contaminants will interfere with and are likely to cause the failure of any devices that comprise wafer surface 42.

Figure 3B:
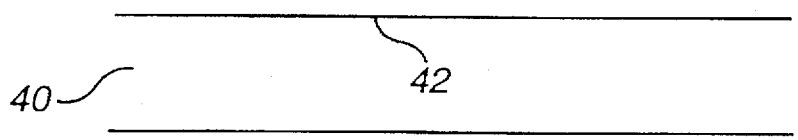
FIG. 3(b) is a schematic cross-section of a semiconductor wafer undergoing an embodiment of the present invention, subsequent to a cleaning step.

Referring to FIG. 3(b), wafer surface 42 has been subjected to a cleaning step that has removed native oxide layer 44 along with other contaminants that may have been present, resulting in an atomically clean wafer surface 42. The cleaning step can be accomplished in a number of ways, including heating wafer surface 42 in the presence of an ambient gas comprising a fluorine species, e.g. nitrogen tetrafluoride ("NF3"), $CF_4$, or HF vapor. To effect the clean, wafer surface 42 can be heated at a temperature of approximately from 50 to 700, preferably 40 to 300, degrees Celsius for a time period of at least approximately 5, preferably 20, seconds at a pressure of approximately from $10^{-6}$ to 760 torr in the presence of a fluorine species having a concentration of at least approximately 1 percent. The combination of fluorine- or chlorine-based cleaning can be preceded or succeeded by an ultraviolet ozone clean at a temperature of less than approximately 500 degrees Celsius.

The fluorine species reduces thermal budget by facilitating the removal of the low-integrity native oxide at temperatures as low as 500° C., as compared with conventional pre-bake temperatures of 1000° C. and above using hydrogen alone.

Figure 3C:
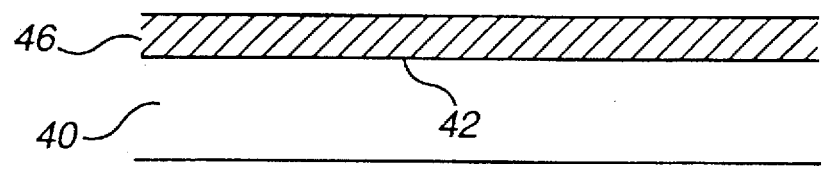
FIG. 3(c) is a schematic cross-section of a semiconductor wafer undergoing an embodiment of the present invention, subsequent to a first oxidation step.

Referring to FIG. 3(c), wafer surface 42 has been subjected to a first oxidation step that has resulted in the formation of an oxide layer 46. Oxide layer 46 is formed by heating wafer surface 42 in the presence of an ambient gas comprising nitrogen and oxygen species, e.g. $N_2O$ and NO. To carry out the first oxidation step, wafer surface 42 can be heated at a temperature of approximately from 700 to 1050, preferably 800 to 1000, degrees Celsius for a time period of at least approximately 10 seconds, preferably 20 to 30 seconds, at a pressure of approximately from $10^{-4}$ to 760 torr in the presence of nitrogen and oxygen species, e.g., with the nitrogen species having a concentration of approximately 50 percent and the oxygen species having a concentration of approximately 50 percent.

The use of nitrogen and oxygen species results in an improved charge to breakdown ratio, an improved resistance to the hot-carrier effect, increased radiation hardness and an overall cleaner oxide-wafer interface. See W. Ting, et al., Applied Physics Letters, vol. 57(26), 1990. Moreover, use of these species permits greater control over the uniformity of the oxidation process. Finally, use of these species mitigates the non-uniformities that commonly result from use of an RTO process. The main drawback of using nitrogen and oxygen species is the relatively slow growth rates associated with these species. However, this drawback can be compensated for by using oxidation enhancers, e.g., $O_3/O_2$, $NF_3$ and ultraviolet light, in conjunction with the nitrogen and oxygen species, as discussed below.

Figure 3D:
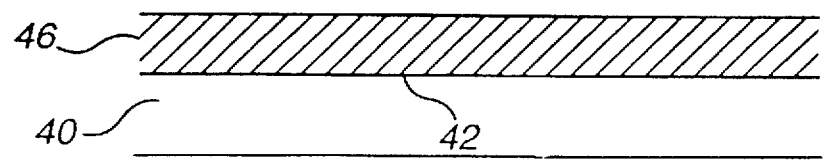
FIG. 3(d) is a schematic cross-section of a semiconductor wafer undergoing an embodiment of the present invention, subsequent to a second oxidation step.

Referring to FIG. 3(d), wafer surface 42 has been subjected to a second oxidation step that has resulted in the further growth of oxide layer 46. The second oxidation step is performed by heating wafer surface 42 in the presence of an ambient gas comprising an ozone and oxygen ("$O_3/O_2$") mixture. To carry out the second oxidation step, wafer surface 42 can be heated at a temperature of approximately from 700 to 1100, preferably 900 to 1000 degrees Celsius for a time period of approximately from 10 to 100, preferably 20 to 40, seconds in the presence of a $O_3/O_2$ mixture, e.g., having an ozone concentration of approximately 20 percent and an $O_2$ concentration of approximately 80 percent.

The presence of ozone in the $O_3/O_2$ mixture results in the introduction of extra atomic oxygen ("O*"), which would not be present if only $O_2$ were used, into reaction chamber 30. Atomic oxygen is highly reactive due to its atomic nature. When the $O_3/O_2$ mixture is introduced into reaction chamber 30, the ozone rapidly decomposes, according to the following chemical reactions:

$$O_3 \text{---RTP} \rightarrow O_2 + O^* \quad O_2 + O_3 \text{---RTP} \rightarrow 2O_2 + O^*,$$

resulting in an overall chemical reaction as follows:

$$2O_3 \text{---RTP} \rightarrow 2O_2 + 2O^*.$$

The ozone is consumed much faster than is the molecular oxygen, due to this chain decomposition of $O_3$. The presence of the highly-reactive O*, as an end product of the ozone decomposition, results in an enhanced oxidation rate. Increases in the oxidation rate of up to 30% over that of conventional methods have been observed.

Preferably, both the cleaning step and the above-described oxidation steps are performed in situ, i.e., in the same reaction chamber, to avoid atmospheric contamination of wafer surface 42. Alternatively, purged transfers of wafer 40 could be performed to avoid atmospheric contamination of wafer surface 42.

Although the above-described present embodiment comprises two oxidation steps that are described sequentially, both steps, in general, can overlap in time or, indeed, be combined into one oxidation step, during which wafer surface 42 is exposed to an ambient gas comprising nitrogen species, ozone and oxygen. In this manner, the $O_3/O_2$ could be introduced into reaction chamber 30 to counteract the slower oxidation rate in an ambient gas comprising nitrogen species and oxygen, alone.

Moreover, the oxidation rates during either the first or the second oxidation steps can be further enhanced by exposing wafer surface 42 to an additional oxidation enhancer, e.g., $NF_3$, or ultraviolet light.

For example, during an oxidation step, wafer surface 42 can be additionally exposed to an ambient gas comprising a fluorine species, e.g., $NF_3$. Preferably, wafer surface 42 is intermittently exposed to the fluorine species, i.e., the fluorine species is pulsed into reaction chamber 30. See Thakur et al., U.S. Pat. No. 5,264,396 (U.S. Class 437/238), issued Nov. 23, 1993, entitled "METHOD FOR ENHANCING NITRIDATION AND OXIDATION GROWTH BY INTRODUCING PULSED $NF_3$". The fluorine species acts as a strong oxidizing agent and, therefore, speeds up the oxidation reaction kinetics. Moreover, the fluorine species helps to suppress hot-electron induced interface degradation.

As a further example of oxidation enhancement, during an oxidation step, wafer surface 42 can be additionally exposed to a photon source, e.g., ultraviolet ("UV") light. Irradiating wafer surface 42 with photons is a means of introducing additional energy into the oxidation process and, therefore, increasing the oxidation rate without generating additional heat, i.e., without increasing the overall thermal budget. In particular, it has been observed that UV photons can enhance oxidation rates by as much as 30%. See E. M. Young, et al., Applied Physics Letters, vol. 50(1), 1987. A typical RTP reaction chamber has most of its photo-response in the UV regime of the electromagnetic spectrum. Therefore, mere use of an RTP reaction chamber enhances the oxidation rate by irradiating wafer surface 42 with UV photons. It is also true of course that other independent sources of photons could be utilized to further enhance oxidation rates, without increasing thermal budget.

Although the above-described steps can be performed at atmospheric pressure with favorable results, improved uniformity of oxynitridation in $N_2O$ and NO ambients can be achieved, if the process is carried out at lower pressures, e.g., from $10^{-6}$ to 700 torr.

Finally, after the oxidation process is completed, wafer surface 42 is subjected to a cooling step, during which wafer surface 42 is cooled in the presence of an ambient gas comprising an inert gas, e.g. argon ("Ar"). The rate of cooling in a typical RTP chamber is at least approximately 20 degrees Celsius per second. The use of an inert gas helps to prevent wafer surface 42 from being contaminated during the cooling period.

Figure 1A:
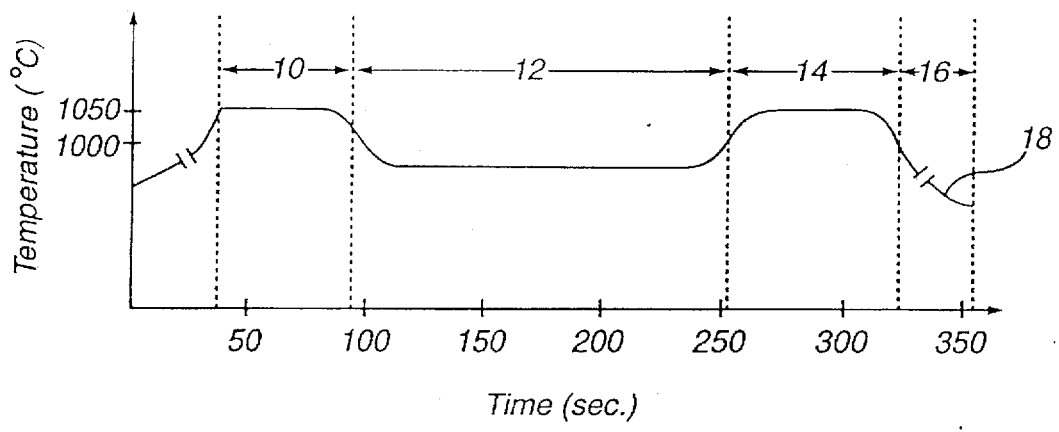
FIG. 1(a) is the temperature versus time profile of a conventional RTO process flow for the formation of an ultrathin oxide layer.
Figure 1B:
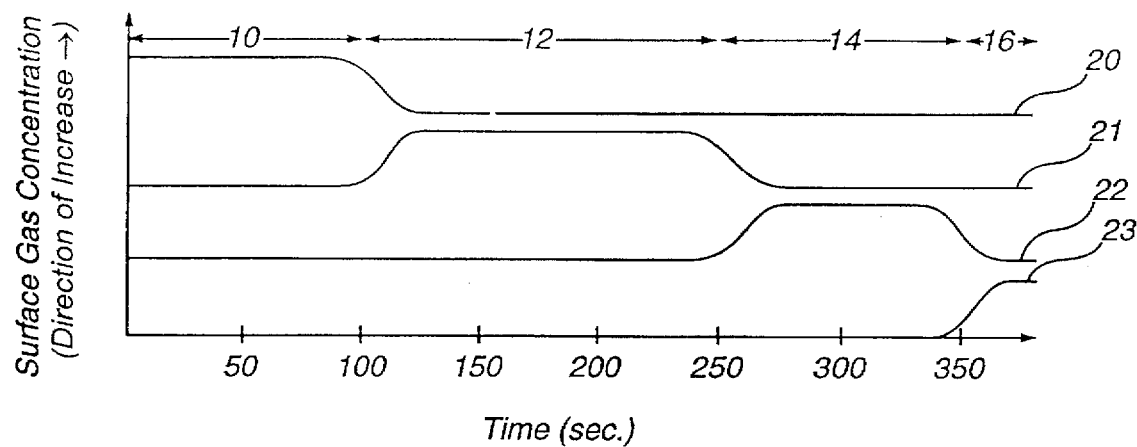
FIG. 1(b) is the concentration versus time profiles at the wafer surface for various gases that are introduced into the reaction chamber during a conventional RTO process flow for the formation of an ultrathin oxide layer.
Figure 4A:
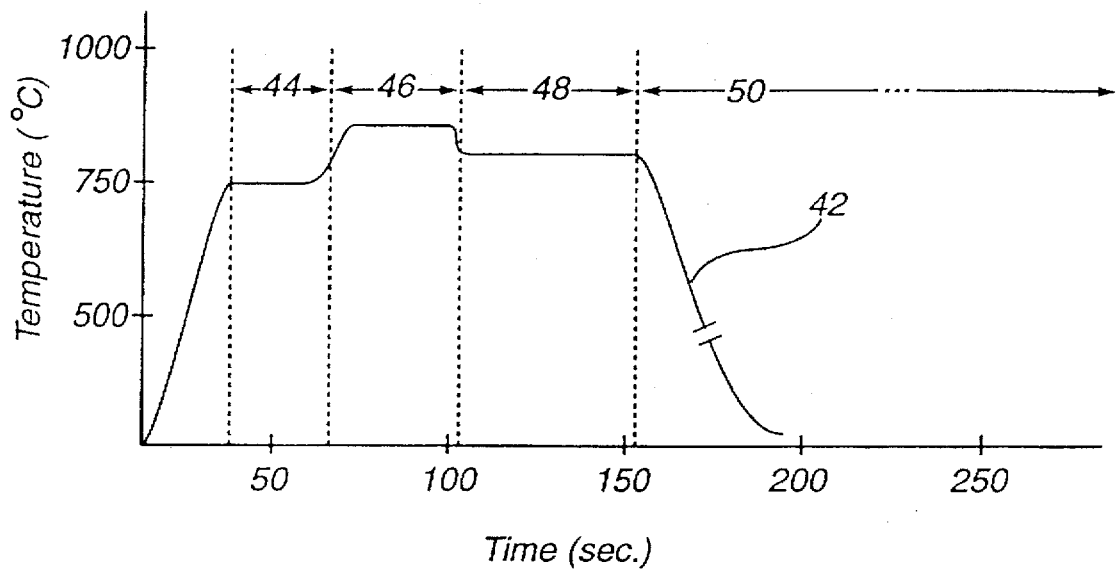
FIG. 4(a) is the temperature versus time profile of a RTO process flow for the formation of an ultrathin oxide layer in accordance with an embodiment of the present invention.

FIG. 4(a) depicts a temperature versus time profile 42 of a RTO process flow for the formation of a 100 angstroms thick layer of oxide in accordance with an embodiment of the present invention. First time period 44 corresponds to a cleaning step; second time period 46 corresponds to a first oxidation step; third time period 48 corresponds to a second oxidation step; and fourth time period 50 corresponds to a cooling step. When compared to profile 18, in FIG. 1(a), for an analogous conventional process, it is readily apparent that the present invention achieves a substantially lower thermal budget.

Figure 4B:
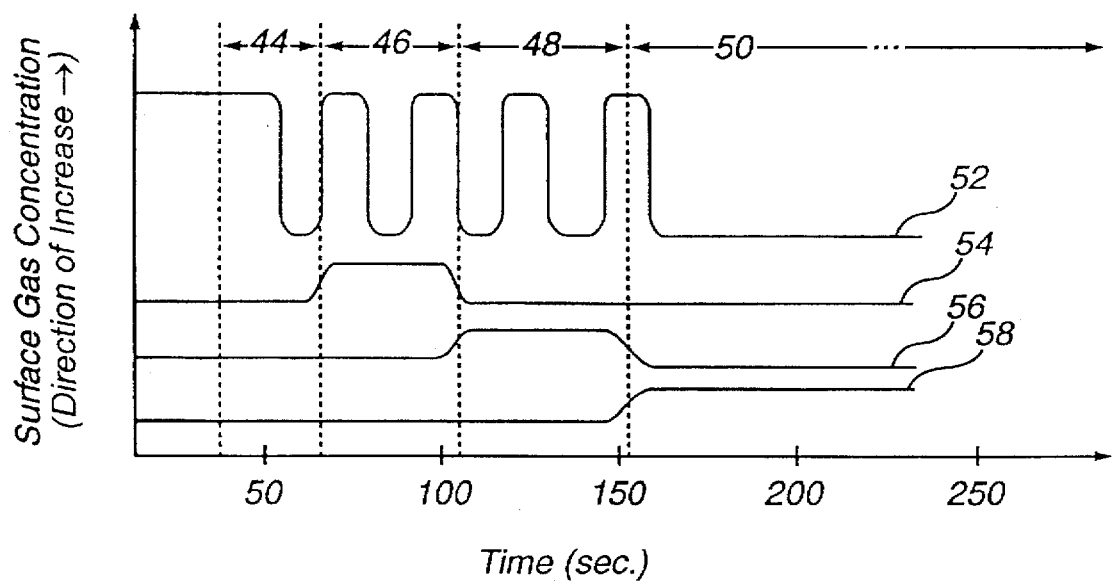
FIG. 4(b) is the concentration versus time profiles at the wafer surface for various gases that are introduced into the reaction chamber during a RTO process flow for the formation of an ultrathin oxide layer in accordance with an embodiment of the present invention.

For the same process, FIG. 4(b) depicts concentration versus time profiles at the wafer surface for various gases that are introduced into the reaction chamber during the process. First profile 52 corresponds to a fluorine species; second profile 54 corresponds to a nitrogen and oxygen species; third profile 56 corresponds to an ozone and oxygen mixture; and fourth profile 58 corresponds to an inert gas.

Each U.S. patent and technical article referenced herein is hereby incorporated by reference thereto as if set forth in its entirety. Although we have illustrated and described a present preferred embodiment of the invention and variations thereon, the invention is not limited thereto but may be embodied otherwise within the scope of the following claims.

We claim:

1. A method of forming a layer of oxide on a surface of a wafer, comprising the following steps:

heating the wafer surface at a first temperature and a first pressure during a first period of time in a first ambient gas comprising nitrogen and oxygen species at a first concentration; and heating the wafer surface at a second temperature and a second pressure during a second period of time in a second ambient gas comprising ozone and oxygen at a second concentration.

2. The method of claim 1, wherein the wafer surface is a semiconductor substrate.

3. The method of claim 2, wherein the semiconductor substrate comprises a material selected from the group consisting of silicon and germanium.

4. The method of claim 1, wherein the first ambient gas comprises a gas selected from the group consisting of $N_2O$ and NO.

5. The method of claim 4, wherein the first ambient gas further comprises a gas comprising ozone and oxygen.

6. The method of claim 1, wherein both heating steps occur at substantially the same time.

7. The method of claim 1, wherein both heating steps are performed in the same reaction chamber.

8. The method of claim 1, further comprising the step of exposing the wafer surface to photons.

9. The method of claim 8, wherein a source of the photons is ultraviolet light.

10. The method of claim 1, further comprising the step of cleaning the wafer surface prior to the first heating step.

11. The method of claim 10, wherein the cleaning step comprises heating the wafer surface at a third temperature and a third pressure during a third period of time in a third ambient gas comprising a species selected from the group consisting of fluorine species and chlorine species.

12. The method of claim 11, wherein the third ambient gas comprises nitrogen tetrafluoride.

13. The method of claim 1, further comprising the step of Cooling the wafer surface during a fourth period of time in a fourth ambient gas comprising an inert gas.

14. The method of claim 13, wherein the inert gas comprises argon.

15. The method of claim 1, further comprising the step of exposing the wafer surface during the first time period to a fifth ambient gas comprising a fluorine species at a fifth concentration.

16. The method of claim 1, further comprising the step of exposing the wafer surface during the second time period to a fifth ambient gas comprising a fluorine species at a fifth concentration.

17. The method claim 15 or 16, wherein the wafer surface is intermittently exposed to the fifth ambient gas.

18. The method of claim 15 or 16, wherein the fifth ambient gas comprises nitrous fluoride.

19. The method of claim 11, wherein the first temperature is approximately from 700 to 1050 degrees Celsius.

20. The method of claim 11, wherein the first pressure is approximately from $10^{-4}$ to 760 torr.

21. The method of claim 11, wherein the first temperature is approximately from 700 to 1050 degrees Celsius.

22. The method of claim 11, wherein the first pressure is approximately from $10^{-4}$ to 760 torr.

23. The method of claim 11, wherein the third temperature is approximately from 50 to 700 degrees Celsius.

24. The method of claim 11, wherein the third pressure is approximately from $10^{-6}$ to 760 tort.

* * * * *